(12) United States Patent
Kwack

(10) Patent No.: US 7,558,147 B2
(45) Date of Patent: Jul. 7, 2009

(54) SEMICONDUCTOR MEMORY DEVICE

(75) Inventor: Seung-Wook Kwack, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 77 days.

(21) Appl. No.: 11/819,794

(22) Filed: Jun. 29, 2007

(65) Prior Publication Data

US 2008/0080294 A1    Apr. 3, 2008

(30) Foreign Application Priority Data

Sep. 29, 2006    (KR) .................... 10-2006-0096354

(51) Int. Cl.
*G11C 8/00* (2006.01)
*G11C 7/00* (2006.01)
(52) U.S. Cl. ............. 365/230.06; 365/193; 365/230.03; 365/230.08
(58) Field of Classification Search ................ 365/193, 365/230.03, 230.06, 230.08
See application file for complete search history.

(56) References Cited

U.S. PATENT DOCUMENTS

| 5,237,536 | A | * | 8/1993 | Ohtsuki | ................. | 365/230.06 |
| 5,708,623 | A | | 1/1998 | Choi | | |
| 6,064,622 | A | * | 5/2000 | Lee et al. | ............... | 365/230.06 |
| 6,219,298 | B1 | * | 4/2001 | Hur et al. | ............... | 365/230.06 |
| 6,590,822 | B2 | * | 7/2003 | Hwang et al. | ............... | 365/222 |
| 6,704,240 | B2 | | 3/2004 | Kang | | |
| 2002/0041536 | A1 | * | 4/2002 | Tomita | ....................... | 365/233 |
| 2005/0141323 | A1 | | 6/2005 | Shim | | |

FOREIGN PATENT DOCUMENTS

| JP | 9-219091 | 8/1997 |
| JP | 10-1999-55067 | 7/1998 |
| KR | 1999-0034768 | 5/1999 |

OTHER PUBLICATIONS

Korean Notice of Preliminary Rejection, with English translation, issued in Korean Patent Application No. KR 10-2006-0096354, mailed Jun. 24, 2008.
Korean Office Action, with English translation, issued in Korean Patent Application No. KR 10-2006-0096354, mailed Oct. 31, 2007.

* cited by examiner

*Primary Examiner*—Ly D Pham
(74) *Attorney, Agent, or Firm*—Mannava & Kang, P.C.

(57) ABSTRACT

A semiconductor memory device includes decoding units for decoding input address signals efficiently. The semiconductor memory device includes a predecoding circuit, a first main decoding circuit, and a second main decoding circuit. The predecoding circuit predecodes address signals. The first main decoding circuit decodes output signals of the predecoding circuit, thereby outputting first decoding signals to a first bank. The second main decoding circuit decodes output signals of the predecoding circuit, thereby outputting second decoding signals to a second bank.

7 Claims, 6 Drawing Sheets

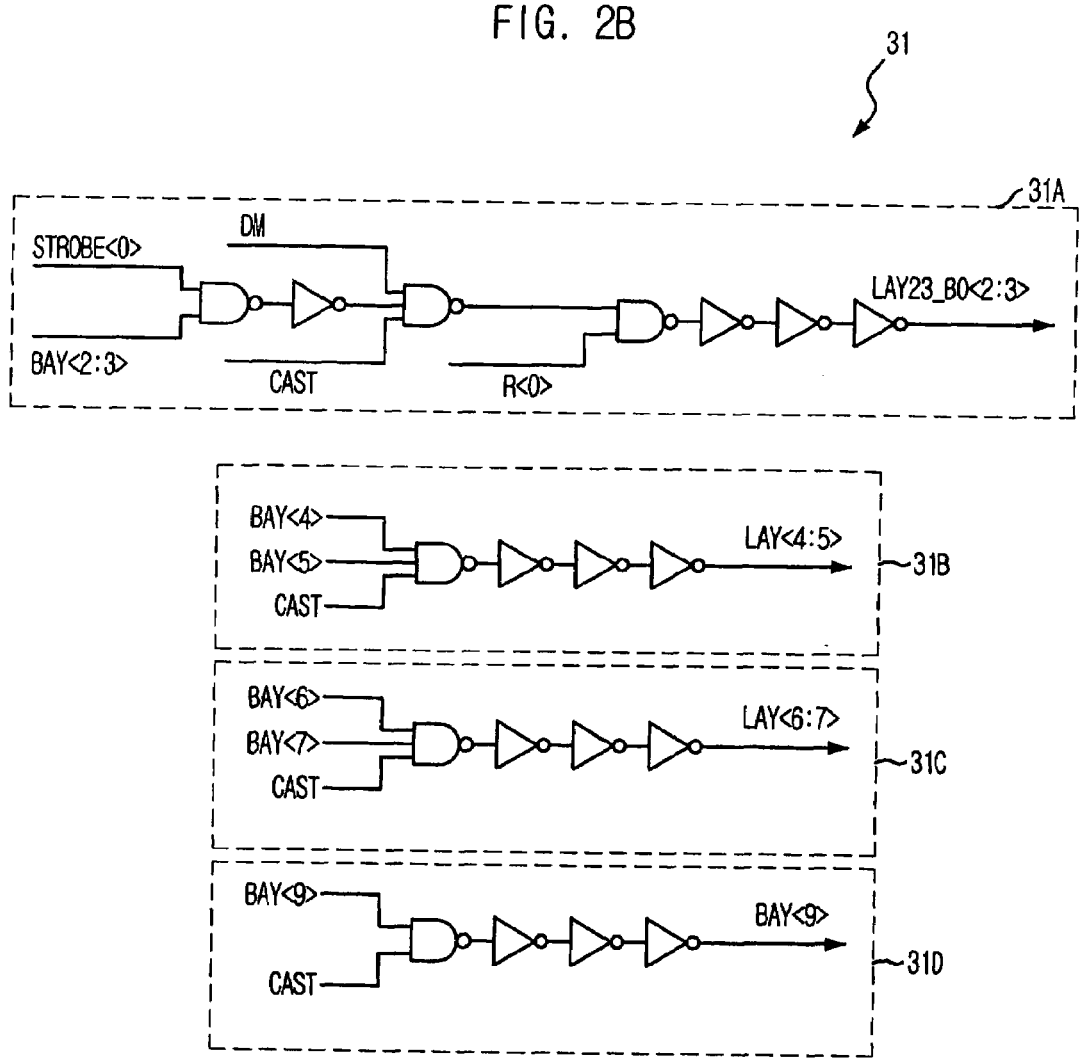

SEMICONDUCTOR MEMORY DEVICE

CROSS-REFERENCE TO RELATED APPLICATIONS

The present invention claims priority of Korean patent application no. 10-2006-0096354, filed in Korean Patent Office on Sep. 29, 2006, which is incorporated by reference in its entirety.

BACKGROUND OF THE INVENTION

The present invention relates to a semiconductor memory device; and, more particularly, to a decoder in a semiconductor memory device.

A semiconductor memory device is an apparatus for storing data and for reading out the stored data. The semiconductor memory device includes a data storage region in which a plurality of unit cells are disposed to store the data and an I/O region in which an I/O circuit is disposed to read out the data stored in the data storage region and to store the data from an external circuit in the data storage region.

The I/O region includes a data input circuit, a data output circuit, an address input circuit and a command input circuit. The data input circuit is to transfer the data from the external circuit to the data storage region in response to a write command. The data output circuit is to output the data stored in the data storage region to the external circuit in response to a read command. The address input circuit is a circuit to input and output address signals which access the unit cells for inputting or outputting the data, respectively, in response to a read command or a write command. The command input circuit is a circuit for interpreting the read command or the write command and then controlling other circuits.

The data storage region has a plurality of banks. The plurality of unit cells which are respectively correspondent to the address signals are included in the bank. Generally, each bank includes a cell block in which a plurality of unit cell are grouped together. Moreover, the decoding circuit is included in the data storage region in order to select one from the plurality of unit cells which corresponds to the input address signal.

FIG. 1 is a block diagram illustrating a semiconductor memory device. Particularly, a decoding circuit of the semiconductor memory device is shown in FIG. 1.

Referring to FIG. 1, the semiconductor memory device includes a plurality of banks 10 and 20 and a decoding circuit 30. Each of the plurality of banks 10 is a region which includes a plurality of unit cells. The decoding circuit 30 includes a predecoder 31 and a main decoder 32 which receive internal address signals BAY<2:7,9> in response to a bank select signal STROBE<0>, decode the inputted signals BAY<2:7,9> and output the decoded signal to the banks 20 and also includes a predecoder 33 and a main decoder 34 which receive the internal address signals BAY<2:7,9> in response to a bank select signal STROBE<1>, decode the inputted signals BAY<2:7,9> and output the decoded signal to the banks 10.

The predecoder 31 is a circuit which first decodes the inputted address signals BAY<2:7,9>. The main decoder 32 is a circuit which again decodes the signal decoded by the predecoder 31. In case of decoding the address signals and outputting the decoded signals to the bank using only one decoder, the decoder becomes so complicated. Therefore, the decoder is classified into the predecoder 31 and main decoder 32 in order to decode the inputted address signals.

FIGS. 2A and 2B are circuit diagrams illustrating the predecoders 31 and 33 illustrated in FIG. 1.

First, as shown in FIG. 2A, the predecoder 33 includes first to fourth internal decoders 33A to 33D. The first internal decoder 33A receives the internal address signals BAY<2:3> in response to a strobe signal STROBE<1> which is activated in response to the activation of the bank 10 and outputs predecoding signals LAY23_B1<2:3> for the bank 10. Here, a bank select signal CAST is a signal which is activated at the time of selecting one from the plurality of banks. A repair signal R<1> is used for addressing a repair territory which is arranged in order to be replaced with a defected normal cell. The internal address signals BAY<2:3> are output signals which are produced by buffering the external address signal in an input buffer. The second internal decoder 33B receives the internal address signals BAY<4> and BAY<5> in response to the bank select signal CAST and outputs first predecoding signals LAY<4:5>. The third internal decoder 33C receives the internal address signals BAY<6> and BAY<7> in response to the bank select signal CAST and outputs second predecoding signals LAY<6:7>. The fourth internal decoder 33D receives the internal address signal BAY<9> in response to the bank select signal CAST and outputs the third predecoding signal LAY<9>.

First, as shown in FIG. 2B, the predecoder 31 includes first to fourth internal decoders 31A to 31D. The first internal decoder 31A receives the internal address signals BAYS<2:3> in response to a strobe signal STROBE<0> which is activated in response to the activation of the bank 20 and outputs predecoding signals LAY23_B0<2:3> for the bank 20. The second internal decoder 31B receives the internal address signals BAY<4> and BAY<5> in response to the bank select signal CAST and outputs first predecoding signals LAY<4:5>. The third internal decoder 31C receives the internal address signals BAY<6> and BAY<7> in response to the bank select signal CAST and outputs second predecoding signals LAY<6:7>. The fourth internal decoder 31D receives the internal address signal BAY<9> in response to the bank select signal CAST and outputs the third predecoding signal LAY<9>.

Typically, the number of banks in the semiconductor memory devices is four or eight and there is introduced a semiconductor memory devices having 16 banks, recently. The increment of banks in numbers generally causes the increment of the number of main decoders and predecoders. Therefore, with the increment of the number of banks, the circuit size of the main decoder and the predecoder inevitably increases in the semiconductor memory device. If the semiconductor memory device is manufactured with a higher integration, the number of unit cells equipped in one bank also increases. As a result, the circuit size of the main decoder and the predecoder corresponding to each bank more increases with the high integration. Further, the circuit wiring for decoding the address signals increases and this makes it difficult to design the circuit configuration.

SUMMARY OF THE INVENTION

Embodiments of the present invention are directed to providing a semiconductor memory device that includes decoding units for decoding input address signals efficiently.

In accordance with an aspect of the present invention, a semiconductor memory device includes a predecoding circuit for predecoding address signals, a first main decoding circuit for decoding output signals of the predecoding circuit, thereby outputting first decoding signals to a first bank, and a second main decoding circuit for decoding output signals of the predecoding circuit, thereby outputting second decoding signals to a second bank In accordance with another aspect of the present invention, a method for driving a semiconductor memory device includes decoding address signals, thereby generating first decoded signals, decoding the first decoded signals in response to a bank select signal to produce a second decoded signals and for outputting the second decoded signal to a first bank, and decoding the first decoded signals in response to the bank select signal to produce third decoded signals and for outputting the third decoded signal to a second bank.

BRIEF DESCRIPTION OF THE DRAWINGS

FIGS. 2A and 2B are circuit diagrams illustrating predecoders in FIG. 1.

DESCRIPTION OF SPECIFIC EMBODIMENTS

Hereinafter, a semiconductor memory device in accordance with the present invention will be described in detail referring to the accompanying drawings.

Figure 1:
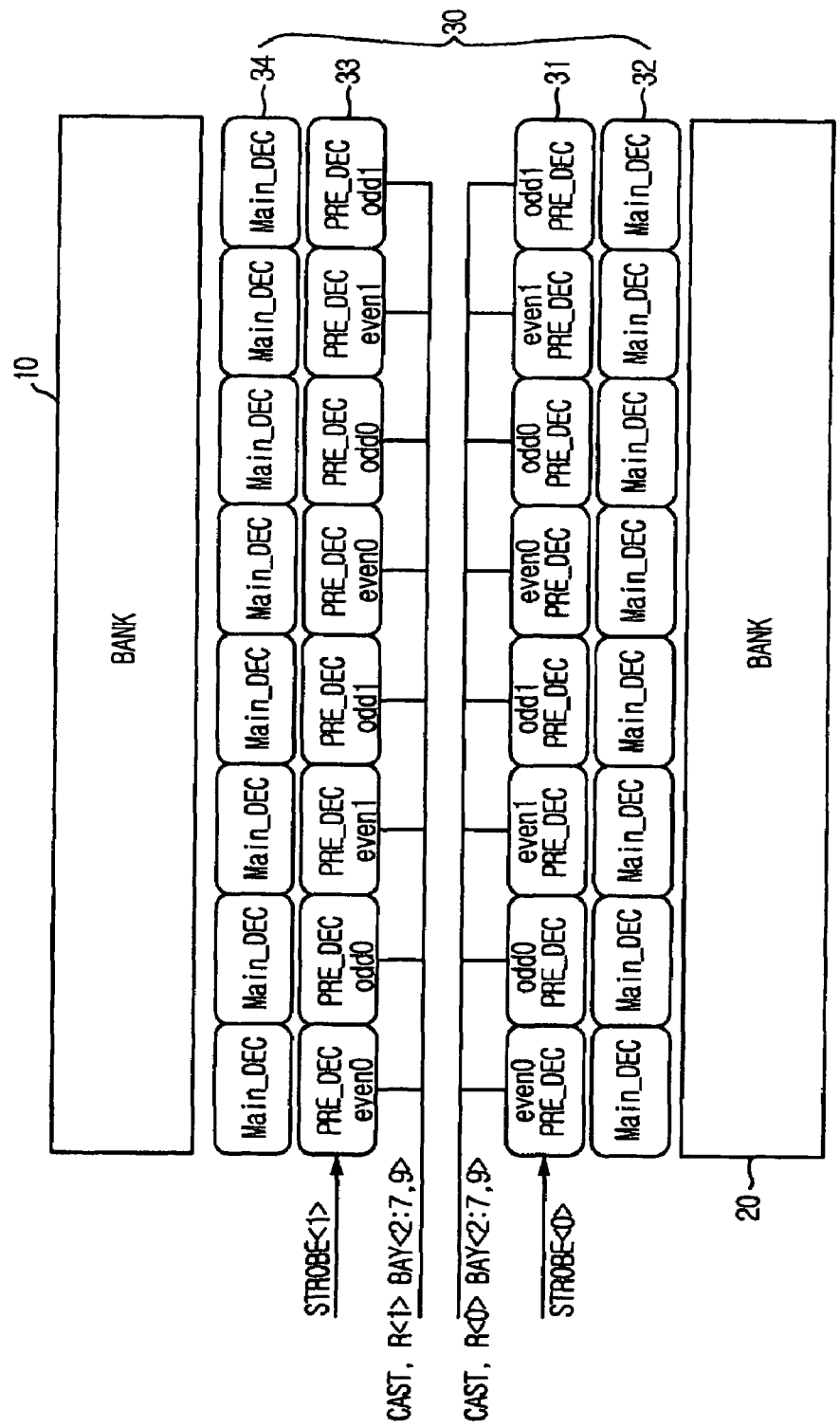
FIG. 1 is a block diagram illustrating a semiconductor memory device.
Figure 2A:
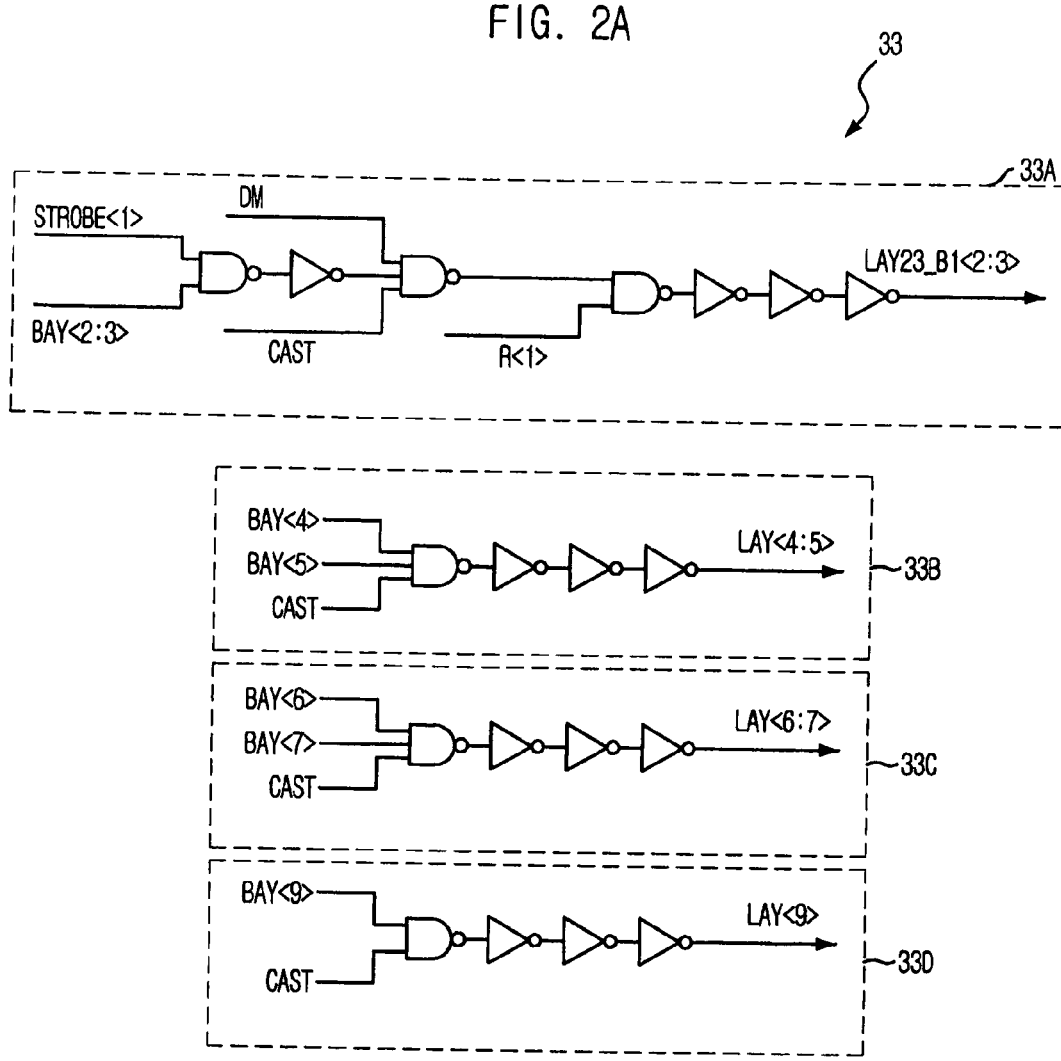
Figure 3:
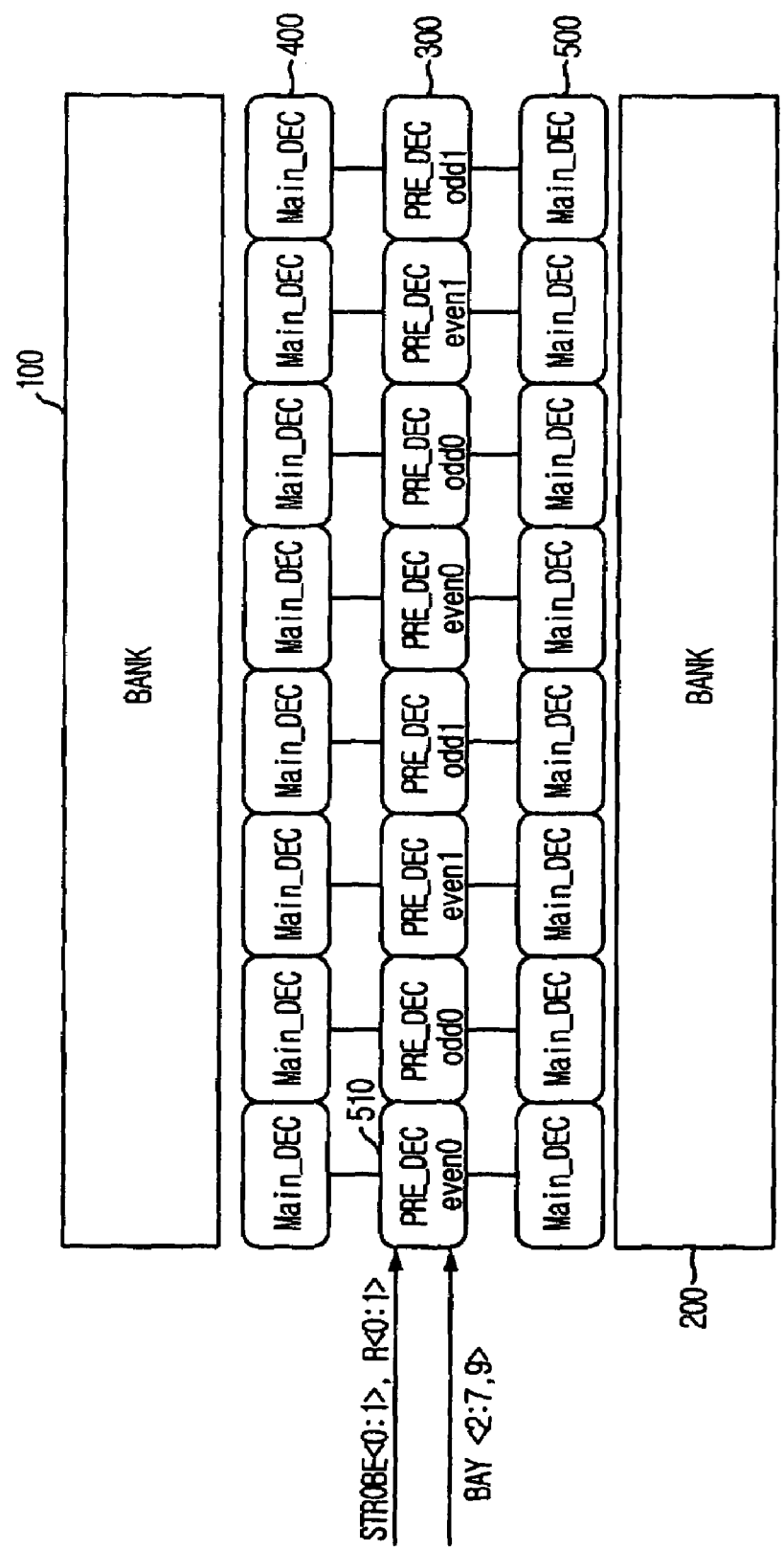
FIG. 3 is a block diagram illustrating a semiconductor memory device according to the preferred embodiment of the present invention.

FIG. 3 is a block diagram illustrating a semiconductor memory device according to the preferred embodiment of the present invention.

Referring to FIG. 3, the semiconductor memory device according to one embodiment of the present invention includes first and second banks 100 and 200, a predecoding circuit 300, a first main decoder 400, and a second main decoder 500. The predecoding circuit pre-decodes internal addresses signals BAY<2:7,9> and then outputs the predecoded signals. The first main decoder 400 decodes the output signals of the predecoding circuit 300 and then outputs the decoded signals to the first bank 100. The second main decoder 500 decodes the output signals of the predecoding circuit 300 and then outputs the decoded signals to the second bank 200.

Figure 4:
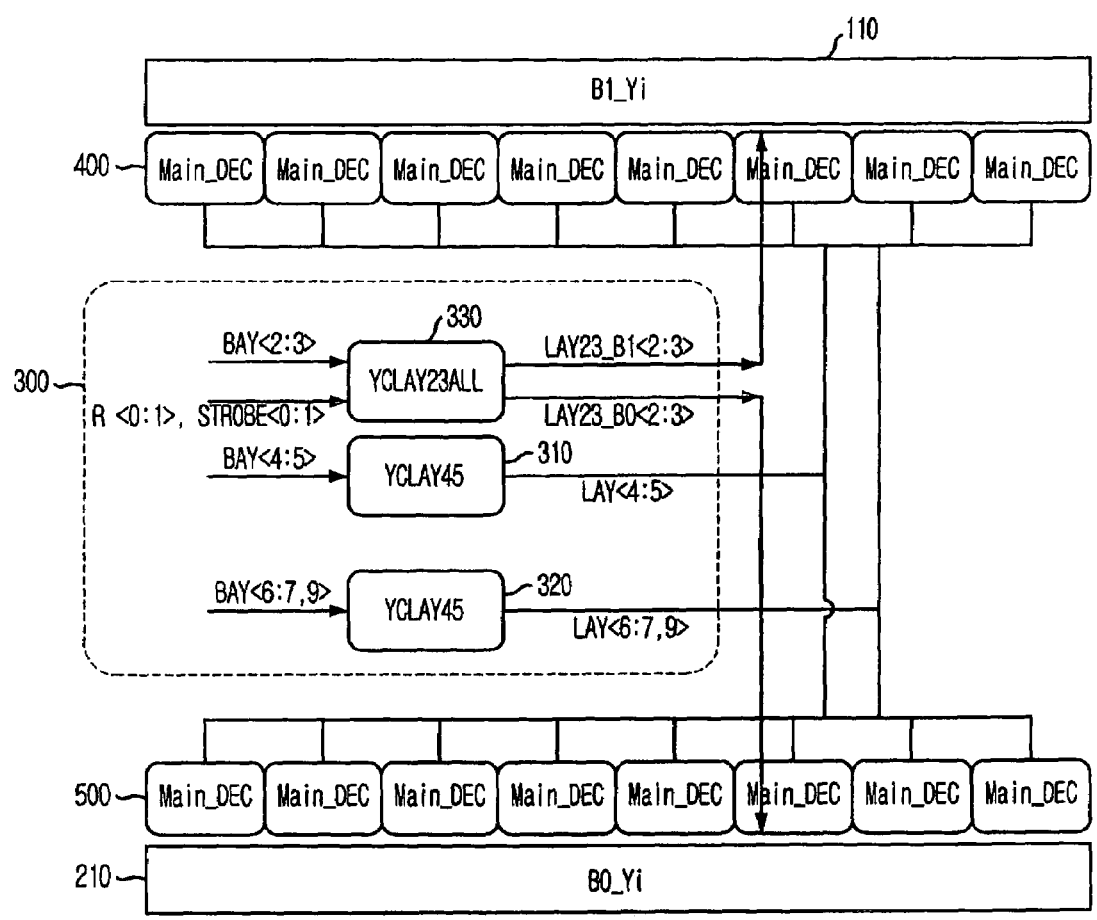
FIG. 4 is a block diagram illustrating a predecoding circuit in FIG. 3.

FIG. 4 is a block diagram illustrating a predecoding circuit in FIG. 3.

Referring to FIG. 4, the predecoding circuit 300 includes a first predecoder 310, a second predecoder 320, and a third predecoder 330. The first predecoder 310 decodes the internal address signals BAY<4:5> and outputs the decoded signals to the first main decoder 400 and the second main decoder 500. The second predecoder 320 decodes the internal address signals BAY<6:7,9> and outputs the decoded signals to the first main decoder 400 and the second main decoder 500. The third predecoder 330 decodes the internal address signals BAY<2:3> in response to the bank select signal STROBE<0:1> and outputs the decoded signals to the first main decoder 400 and the second main decoder 500. Here, a transfer circuit 110 is a circuit for selecting a bit line in the bank 100 in response to the decoded signals from the main decoders. A transfer circuit 210 is a circuit for selecting a bit line in the bank 200 in response to the decoded signals from the main decoders. Here, the address signals BAY<2:7,9> are the internal address signals which are produced by buffering input column address signals. In some cases, the present invention can be applied to a decoding circuit to which row address signals are inputted.

Figure 5:
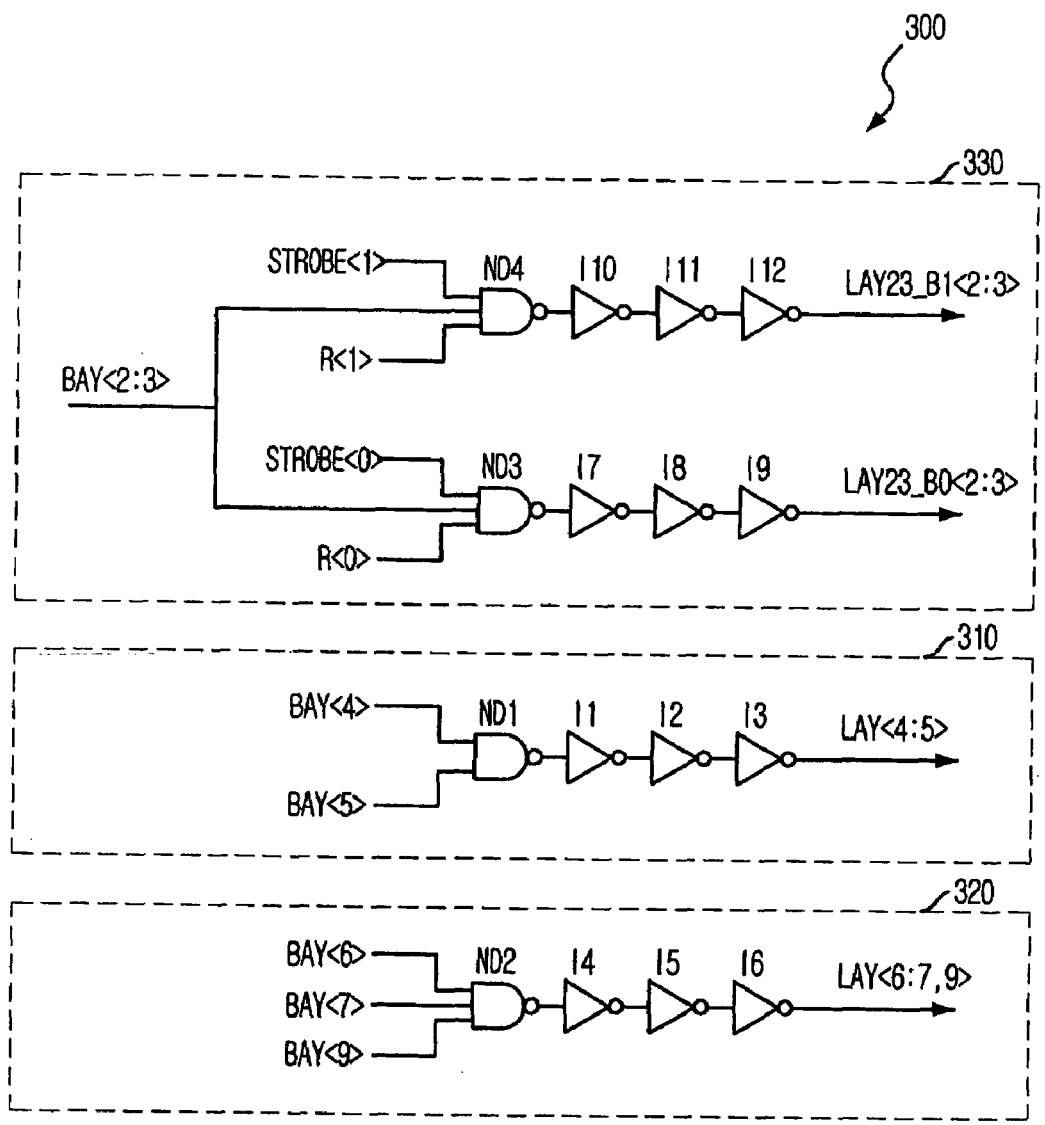
FIG. 5 is a detailed circuit diagram illustrating the predecoding circuit of FIG. 4.

FIG. 5 is a detailed circuit diagram illustrating the predecoding circuit of FIG. 4.

Referring to FIG. 5, the first predecoder 310 includes a first NAND gate ND1 to receive the internal address signals BAY<4:5> and a plurality of inverters I1 to I3 to delay the output signal of the first NAND gate ND1. The second predecoder 320 includes a second NAND gate ND2 to receive the internal address signals BAY<4:7,9> and a plurality of inverters I4 to I6 to delay the output signal of the second NAND gate ND2. The third predecoder 330 includes a third NAND gate ND3, which receives the bank select signal STROBE<0>, the internal address signals BAY<2:3> and the repair signal R<0>, a plurality of the inverter I7 to I9 to delay the output signal of the third NAND gate ND3, a fourth NAND gate ND4 which receives the bank select signal STROBE<1>, the internal address signals BAY<2:3> and the repair signal R<1>, and a plurality of the inverter I10 to I12 to delay the output signal of the fourth NAND gate ND4. The repair signals R<0> and R<1> are respectively activated based on whether the input address signals are normal address signals or repair address signals. The bank select signals STROBE<0> and STROBE<1> are respectively activated based on the activation of the corresponding banks.

The semiconductor memory device according to the preferred embodiment of the present invention, in which the external address signals are inputted and the internal address signal generating circuit for accessing the unit cells corresponding to the inputted address signals are employed, is characterized in that the main decoders are provided on a bank by bank basis and the bank shares the predecoder with the adjacent bank. In the events, one predecoder can be shared with two or more banks. More concretely, the address signal BAY<4:7,9> of the input address signal BAY<2:7,9> are decoded by the predecoders 310 and 320 and the decoded signals are simultaneously outputted into the first and second banks. Next, the decoded signals lay23_B1<2:3> are produced by decoding the address signal BAY<2:3> and the decoded signals lay23_B1<2:3> are outputted into the first bank or the second bank in response to the bank select signal STROBE<0:1> having the bank information. By sharing the predecoder with adjacent banks, the size of the circuit to receive and decode the input address signals can be reduced remarkably.

As apparent from the present invention, the decoder for decoding input address signals in the semiconductor memory device can be reduced in size. Accordingly, the reduction of the size in the decoder of the memory device has an effect on a cost of manufacturing processes.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   a predecoding circuit for predecoding address signals;
   a first main decoding circuit for decoding output signals of the predecoding circuit, thereby outputting first decoding signals to a first bank; and
   a second main decoding circuit for decoding output signals of the predecoding circuit, thereby outputting second decoding signals to a second bank,
   wherein the predecoding circuit includes:

a first predecoder for decoding first address signals which correspond to a predetermined number of bits starting from a most significant bit of the address signals and for outputting the decoded signals to the first and the second main decoding circuit; and a second predecoder for decoding second address signals which are selected from rest address signals except for the first address signal of the address signals and for outputting the decoded signals to the first or the second main decoding circuit in response to a bank select signal.

2. The semiconductor memory device of claim 1, wherein the address signals include column address signals.

3. The semiconductor memory device of claim 1, wherein the first predecoder includes:
- a logic gate for performing a NAND operation on the first address signals; and
- a buffer unit for buffering output signals of the logic gate.

4. The semiconductor memory device of claim 1, wherein the second predecoder includes:
- a first logic gate for performing a NAND operation on the second address signals and a first bank select signal;
- a second logic gate for performing a NAND operation on the second address signals and a second bank select signal;
- a first buffer unit for buffering output signals of the first logic gate; and
- a second buffer unit for buffering output signals of the second logic gate.

5. The semiconductor memory device of claim 1, wherein the predecoding circuit outputs the output signals to the first main decoding circuit or the second main decoding circuit in response to a strobe signal.

6. A method for driving a semiconductor memory device, comprising:
- pre-decoding address signals to thereby generate first decoded signals;
- first-decoding the first decoded signals in response to a bank select signal to produce a second decoded signals and for outputting the second decoded signal to a first bank; and
- second-decoding the first decoded signals in response to the bank select signal to produce third decoded signals and for outputting the third decoded signal to a second bank, wherein pre-decoding the address signals includes:
- decoding first address signals which correspond to a predetermined number of bits starting from a most significant bit of the address signals to output decoded signals to the first and second-decoding; and
- decoding second address signals which are selected from rest address signals except for the first address signal of the address signals to output decoded signals to the first or second-decoding in response to the bank select signal.

7. The method of claim 6, wherein the address signals include column address signals.

* * * * *